(12) United States Patent
Huffstutler

(10) Patent No.: US 8,226,874 B2
(45) Date of Patent: Jul. 24, 2012

(54) METHOD AND APPARATUS FOR PROTECTING AN ARTICLE DURING OPERATION

(75) Inventor: Keith Wayne Huffstutler, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 1332 days.

(21) Appl. No.: 11/847,949

(22) Filed: Aug. 30, 2007

(65) Prior Publication Data

US 2009/0061238 A1 Mar. 5, 2009

(51) Int. Cl.
*B29C 43/02* (2006.01)
(52) U.S. Cl. ......... 264/272.17; 264/272.11; 264/272.12; 264/272.15; 438/112
(58) Field of Classification Search ............ 264/272.11, 264/272.12, 272.15, 272.17; 438/112
See application file for complete search history.

(56) References Cited

U.S. PATENT DOCUMENTS

| 3,579,821 | A | * | 5/1971 | Kurisu ..................... 264/272.14 |
| 4,063,349 | A | * | 12/1977 | Passler et al. .................... 29/841 |
| 4,293,377 | A | * | 10/1981 | Miyajima ....................... 216/17 |
| 4,768,286 | A | * | 9/1988 | Ketcham ......................... 29/841 |
| 5,054,193 | A | * | 10/1991 | Ohms et al. ..................... 29/840 |
| 6,150,193 | A | * | 11/2000 | Glenn ............................ 438/113 |
| 7,101,617 | B2 | | 9/2006 | Cavallaro et al. |
| 2005/0013990 | A1 | * | 1/2005 | Cavallaro et al. ............. 428/323 |

* cited by examiner

*Primary Examiner* — Joseph Del Sole
*Assistant Examiner* — Timothy Kennedy
(74) *Attorney, Agent, or Firm* — Yudell Isidore Ng Russell PLLC

(57) ABSTRACT

A process for making a protective assembly for an article, such as a circuit, includes forming a flexible layer of the protective assembly over the circuit to be protected during circuit operation, wherein said protective assembly is non-adhesive to the circuit and wherein the flexible layer is conformed to the topography of the circuit and non-adhesive to the circuit.

11 Claims, 4 Drawing Sheets

METHOD AND APPARATUS FOR PROTECTING AN ARTICLE DURING OPERATION

BACKGROUND OF THE INVENTION

1. Technical Field

The present invention relates in general to protecting an article, such as a circuit, during operation.

2. Description of the Related Art

Integrated circuit devices are often tested at test stations including a test handler and automated tester equipment (ATE). When testing begins, integrated circuit devices to be tested (each referred to a device under test (DUT)) are placed in a tray, tube, or other container in a loading area adjacent the ATE. Each DUT is then subjected to testing by the ATE one at a time or in multiples. To test a particular DUT, a pick-and-place mechanism of the test handler places the DUT on a test socket or contactor at a test head of the ATE. The ATE then tests the performance and/or reliability of the DUT utilizing one or more predetermined tests. After testing, the test handler places the tested DUT in one of multiple trays, or tubes in a sorting area based on the test results determined by the ATE. Thus, integrated circuit devices passing the test are segregated from those failing the test.

Because ATEs are not capable of testing all DUTs (e.g., DUTs having a higher performance than the ATE can accurately measure) and because the electromechanical interface of the ATE's interconnect assembly may adversely affect IC package test accuracy and reliability, a load board (sometimes referred to as a test interface unit) is often used to mechanically and electrically interface a DUT with the test head of the ATE. A load board usually includes a test socket or a contactor for holding a DUT on one side of the load board and testing support circuitry on the opposing side of the load board that connects to the test head of the ATE.

For some DUTs, testing is performed at one or more high and/or low temperatures to verify correct operation within a specified temperature range. When low temperature testing is performed, ice formation on the load board from ambient moisture may be a concern in that the ice can support leakage currents between points in the support circuitry on the load board, leading to improper operation or failure of the support circuitry on the load board and/or inaccurate test results.

To reduce ice formation, a "dry" gas, such as dry compressed air or nitrogen, is often utilized to purge the immediate environment of the support circuitry on the load board. However, many third party testing facilities, which are contracted by article manufacturers to perform testing, are not able to guarantee the moisture content of their compressed air sources and do not have an alternative dry gas available. Consequently, the present invention appreciates that it would be desirable to protect a circuit, such as a load board, during an operation, such as DUT testing.

U.S. Pat. No. 7,101,617 B2 to Cavallaro et al. discloses a removable protective coating for an electronic component that includes a thermoplastic film and a silicone layer on the underside of the film that contacts the electronic component. The silicon layer is formed by the application of heat or vacuum to silicone microcapsules coating the underside of the thermoplastic film. One disadvantage of the process disclosed by Cavallaro et al. is that the heat utilized to form the removable protective coating disclosed by Cavallaro et al. can damage the very electronic components to be protected. Moreover, the protective coating disclosed by Cavallaro et al. is not re-usable after removal from the electronic component.

SUMMARY OF THE INVENTION

The present invention provides improved processes and protective assembly for protecting an article, such as a circuit, during operation.

According to one embodiment of the present invention, a process for making a protective assembly for an article, such as a circuit, includes forming a flexible layer of the protective assembly over the circuit to be protected during circuit operation, wherein said protective assembly is non-adhesive to the circuit and wherein the flexible layer is conformed to the topography of the circuit and non-adhesive to the circuit.

According to another embodiment of the present invention, a protective assembly including a flexible layer conformed to a topography of the circuit is provided. The protective assembly is installed in close relation over the circuit. The circuit is then operated while the protective assembly is installed over the circuit.

In still another embodiment of the present invention, a protective assembly for protecting a circuit during operation includes a flexible layer conformed to the topography of the circuit, wherein the protective assembly is non-adhesive to the circuit.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
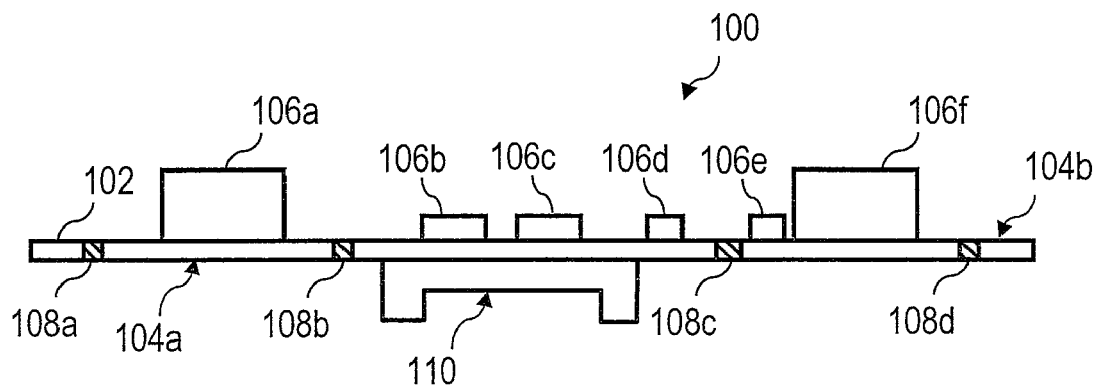
FIG. 1 is a sectional view of an exemplary article that may be subjected to testing.

With reference now to the figures and, in particular, with reference to FIG. 1, there is illustrated a section view of an exemplary article 100 that may be utilized in a test environment. In the depicted example, article 100 comprises a circuit board, such as a load board 102, having a first side 104a, a second side 104b, and a plurality of through holes 108a-108d extending between sides 104a, 104b. Through holes 108a-108d, which are preferably distributed throughout load board 102, can be of a variety of sizes and intended for a variety of uses, including, for example, use as vias or screw holes.

A contactor 110 is disposed on first side 104a of load board 102. As is well known in the art, contactor 110 includes a plurality of contact pins (not illustrated) arranged to correspond to a plurality of external lead pins of an integrated circuit DUT. Contactor 110 is electrically connected to support circuitry comprising electronic components 106a-106f mounted on second side 104b of load board 102. As described above, electronic components 106a-106f support testing by an ATE of a DUT placed within contactor 110 by a test handler.

Figure 2:
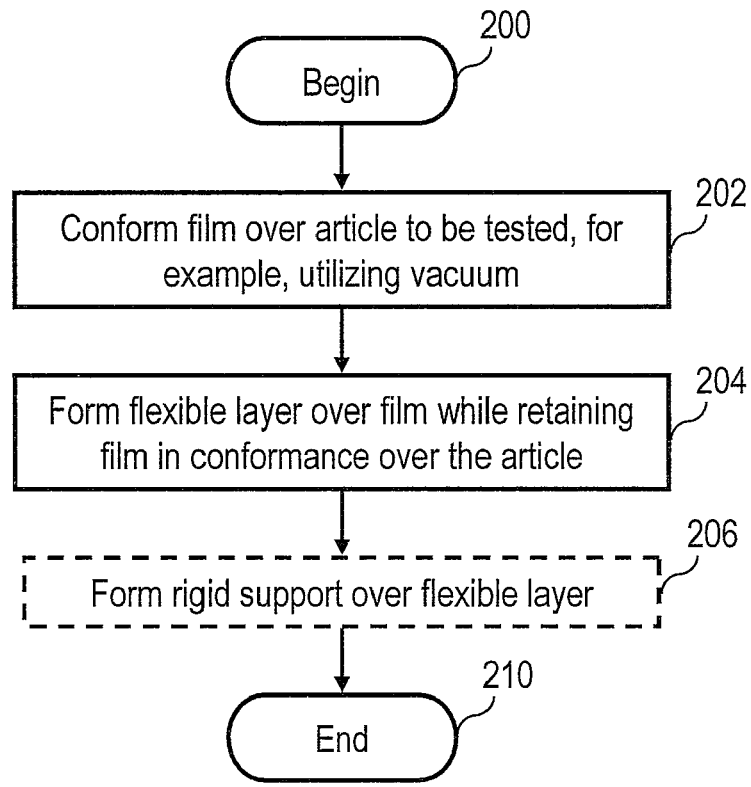
FIG. 2 is a high level logical flowchart of an exemplary process for making a protective assembly for an article to be tested.

Referring now to FIG. 2, there is depicted a high level logical flowchart of an exemplary process for making a protective assembly for an article to be tested. To promote better understanding of the present invention, the depicted method is described with additional reference to FIGS. 3A-3C, which depict partial sectional views of an apparatus 300 utilized to make a protective assembly for a load board 102 used in the low temperature testing of a DUT.

As shown in FIG. 2, the exemplary process of making a protective assembly begins at block 200 and then proceeds to block 202, which depicts conforming a flexible film over a surface of the article to be protected (or a positive mold thereof). In the exemplary embodiment shown in FIGS. 3A-3C, a flexible film 310, such as silicone film, is conformed over second side 104b of load board 102 under the urging of a vacuum. The vacuum is applied to flexible film 310 via through holes 108 in load board 102 by a vacuum source 302 connected by a vacuum line 306 to a vacuum chamber 304 abutting first side 104a of load board 102. If desired, vacuum chamber 304 can be optionally temporarily sealed to first side 104a by tape or other sealing means to improve the strength of the vacuum. Of course, for other articles, the holes in the surface of the article by which vacuum is applied to the flexible film may not be through holes extending between opposing sides of the article, but may instead be realized as apertures through which vacuum is applied via interior channels in the article.

Flexible film 310 may be formed of a variety of materials and may further have any of a variety of thicknesses. In one preferred embodiment applicable, without limitation, to the preparation of protective assemblies for electronic articles, flexible film 310 is formed of an elastomer, such as a silicone rubber film, having a thickness of between 0.010 and 0.020 of an inch. Silicone rubber (e.g., polymerized siloxane or polysiloxane) advantageously exhibits thermal stability over a wide range of temperatures (e.g., −60 to 250° C.), forms watertight seals, is highly flexible (up to 490% elongation), has good insulative properties, is anti-adhesive and has low chemical reactivity. Experimentally, a Rogers Corporation silicon film part number HT-6210 having an operating temperature range of −62 to 218° C. and maximum temperature of 260° C. was successfully utilized. In testing other articles, different materials having other material properties and thickness may be more appropriate or desirable, as will be understood by those skilled in the art.

It will be appreciated that in conforming a flexible film over the surface of an article, in some cases the topography or shape imposed on the flexible film will not exactly correspond to that of the surface of the article, particularly at locations corresponding to abrupt variations in the surface topography of the article. Such small variations between the topography or shape of the flexible film and that of the corresponding surface of the article create tolerance in the fit between the resulting protective assembly and the article to be tested, facilitating intact removal and reinstallation of the protective assembly. Removal and reinstallation of the protective assembly is also assisted by the use of a material, such as silicone rubber, that is non-adhesive to the article (e.g., circuit).

Returning to FIG. 2, the process proceeds from block 202 to block 204, which illustrates forming a flexible layer to support or provide backing for the film while retaining the film in conformance with the topography of the article to be tested. The flexible layer supports the flexible film in conformance with the topography of the surface of the article to be tested. The flexibility of the flexible layer advantageously permits the resulting protective assembly to be repeatedly removed intact from and reinstalled on the article to be tested. The flexible layer is preferably formed of a material capable of withstanding the conditions (e.g., temperature range) under which testing will be performed.

Figure 3A:
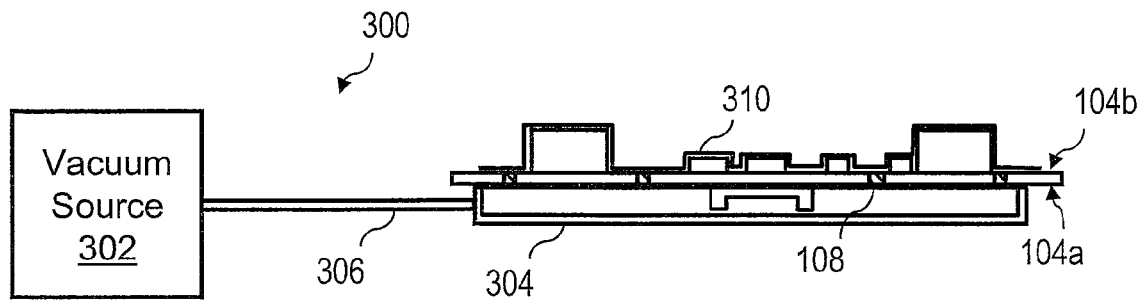
FIG. 3A-3D depict partial sectional views of an apparatus utilized to make a protective assembly for an article to be tested.
Figure 3B:
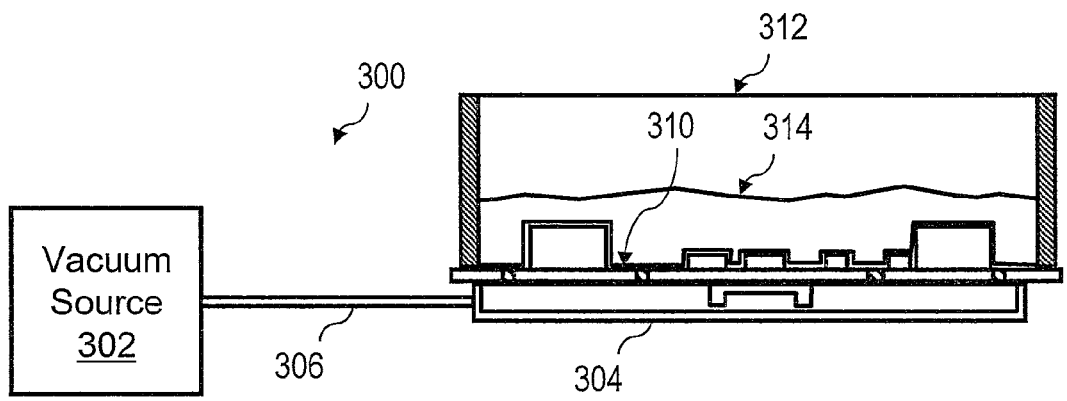

In the exemplary embodiment shown in FIG. 3B, vacuum remains applied to flexible film 310 to retain flexible film 310 in conformance over second side 104b of load board 102, as described with reference to FIG. 3A. With the vacuum applied, an open-topped mold 312 of metal or plastic, for example, is placed over second side 104b of load board 102, and a flexible layer 314 is formed within mold 312 over flexible film 310. For example, flexible layer 314 may be formed of a silicone material, such as commercially available room temperature vulcanization (RTV) silicone, two-part silicone, silicone putty, silicone sponge, or silicon foam cured in accordance with the product instructions. In this case, the flexible layer 314 is directly adhered to flexible film 310. The precise thickness of flexible layer 314 is non-critical, but should be sufficient to flexibly support flexible film 314 in a configuration conforming to front side 104a of load board 102 in the absence of vacuum. Experimentally, a layer of RTV silicone such as Dow Corning 9-1363 having a thickness of 0.250 inch was sufficient to form flexible layer 314.

Referring again to FIG. 2, following formation of the flexible layer, a rigid support may optionally be formed over the flexible layer, as depicted at block 206. Again, the material from which the rigid support is formed is preferably selected from among materials, such as epoxy, metal and plastic, capable of withstanding the conditions (e.g., temperature range) under which testing will be performed. The optional rigid support enables easier handling of the protective assembly and facilitates attachment of the protective assembly to the protected article during testing, as described further below with reference to FIG. 5.

Figure 3C:
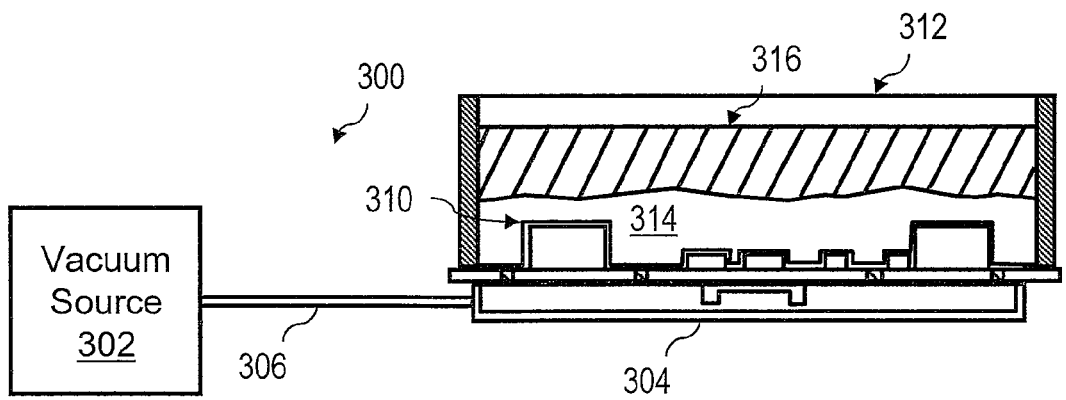

As shown in FIG. 3C, in one exemplary embodiment, a rigid support 316 is formed within mold 312 over flexible layer 314. Rigid support 316 is optionally, but not necessarily formed with vacuum applied to flexible film 310, as hereinbefore described. In one preferred embodiment, rigid support 316 is formed of a commercially available self-leveling epoxy cured in accordance with product instructions. In this embodiment, the rigid support 316 formed of epoxy adheres directly to flexible layer 314. In other embodiments, rigid layer 316 is alternatively formed of a metal or plastic and may further be adhered to flexible layer 314, for example, by an adhesive. As with flexible layer 314, the thickness of rigid support 316 is non-critical. However, if rigid support 314 is present, it should be of sufficient thickness to achieve the desired mechanical strength, given the intended testing, handling and expected lifetime of the protective assembly.

Figure 3D:
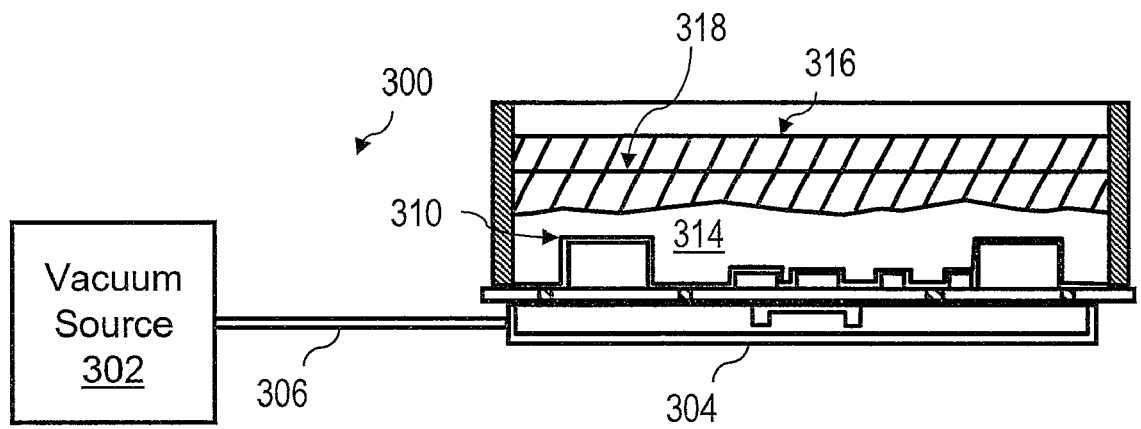
Figure 3E:
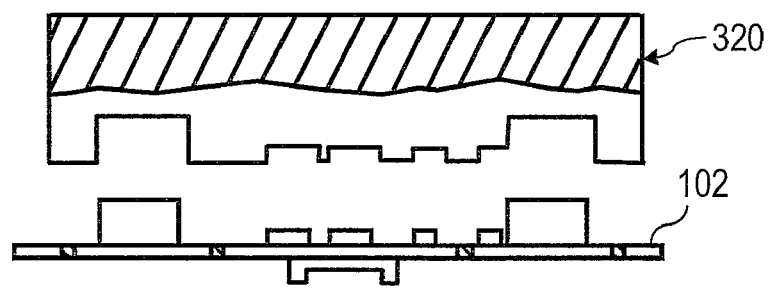
FIG. 3E illustrates a sectional view of a protective assembly for an article to be tested, wherein the protective assembly is a result from the process depicted in FIG. 2.

Referring again to FIG. 2, following the formation of the rigid support, if present, the exemplary process of making the protective assembly shown in FIG. 2 ends at block 210. Thereafter, application of vacuum by a vacuum source 302 can be discontinued, and, if desired, the protective assembly 320 resulting from the process of FIG. 2 can be manually removed intact from the article to be tested (e.g., load board 102), as shown in FIG. 3E. If necessary, protective assembly 320, one or more load boards 102, and integrated circuit DUTs to be tested can then be shipped to a third party testing facility for testing of the load board(s) 102.

The process depicted in FIG. 2 is subject to a number of possible variations falling within the scope of the present invention. In some variations, no flexible film is utilized, and the flexible layer (e.g., flexible layer 314) is formed directly on the article to be protected. This variation is particularly suitable for protecting circuits or other articles which do not have highly variable topographies. It is desirable if the flexible layer is formed of a material that is non-adhesive to the article. In addition, in some variations, the flexible layer and/or the flexible film, if present, can be formed in the absence of a vacuum or under a positive applied pressure. In still other variations, radio frequency (RF) or Faraday shielding can be provided by the protective assembly by placing a shielding material (e.g., a copper or aluminum sheet or mesh, conductive plastic or conductive paint) in or on one of the constituent layer(s) of the protective assembly. For example, FIG. 3D depicts an embodiment in which an RF shield 318 of copper sheet is suspended within rigid layer 316. If the article to be protected is a circuit, it is generally preferable if the shielding is disposed so that it does not contact the circuit when the protective assembly is installed.

Figure 5:
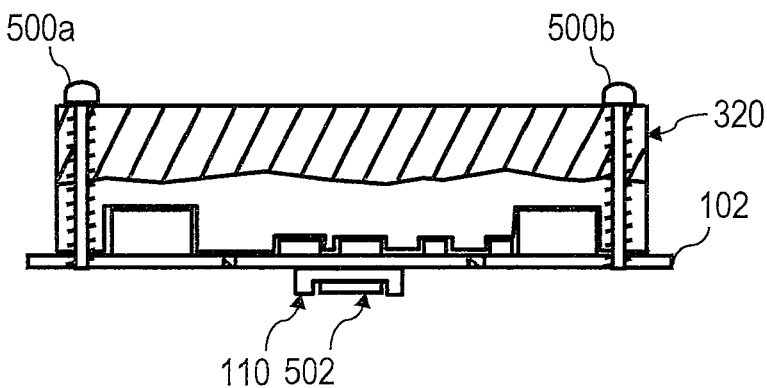
FIG. 5 illustrates an exemplary article having a protective assembly attached thereto during testing.
Figure 4:
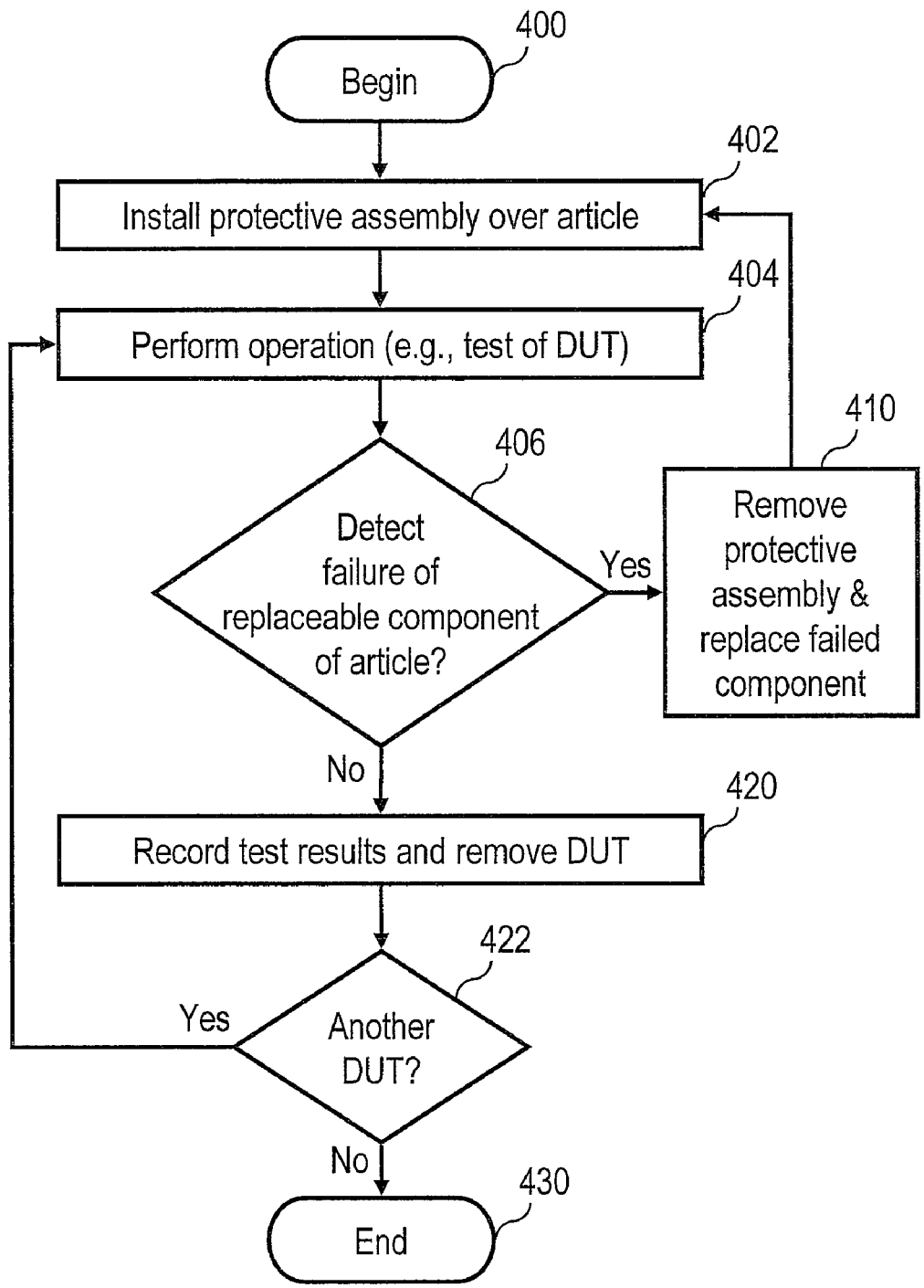
FIG. 4 is a high level logical flowchart of an exemplary process for testing one or more articles while protecting the article(s) with a protective assembly.

With reference now to FIG. 4, there is illustrated a high level logical flowchart of an exemplary process for protecting an article with a protective assembly in accordance with the present invention. The process begins at block 400 and thereafter proceeds to block 402, which depicts installing a protective assembly formed in accordance with the process of FIG. 2 (or a variation thereof) over the article. In some embodiments of the process, the installation depicted at block 402 can entail simply placing the protective assembly 320 on or over the relevant portion of the article to be protected during a test. If a more secure fit is desired, the protective assembly 320 can be removably attached to the article, for example, by one or more clamps, fasteners, such as screws, and/or other attachment means. For example, FIG. 5 illustrates a load board 102 having a protective assembly 320 attached thereto by screws 500a, 500b in order to protect the support circuitry used to test a DUT 502 within contactor 110. Tightening screws 500a, 500b compresses flexible layer 314 and flexible film 310, if present, creating a watertight seal between protective assembly 320 and second side 104b of load board 102 that protects the support circuitry on second side 104b from being exposed to ice formation. Installation of the protective assembly over the article to be tested may be aided by the use of a metal or plastic frame to hold or engage rigid support 316, if present, or flexible layer 314. If a frame is utilized in the installation of protective assembly 320, clamps or fasteners may attach the frame rather than the protective assembly 320 to the article during testing.

Following block 402, the process shown in FIG. 4 proceeds to block 404. Block 404 represents performing a selected operation while the protective assembly is installed on and protecting the article. For embodiments in which the article is a load board 102, performing the test typically includes an ATE causing DUT 502 to be in operation or stimulated with electrical signals via the support circuitry on second side 104b of load board 102 and observing output signals from the support circuitry while subjecting DUT 502 to a low temperature (e.g., −50° C.). As discussed above, protective assembly 320 protects electronic components 106 from being exposed to ice formation due to excessive moisture in the immediate environment of load board 102 when DUT 502 is lowered to the target test temperature. In addition to providing protection against exposure to ice formation, protective assembly 320 also protects against air currents and can further protect against electromagnetic interference (EMI) if protective assembly 320 includes an RF shield.

The process then proceeds from block 404 to block 406, which depicts an automated or human determination of whether or not a failure of a replaceable component of the article has been detected during the test. For embodiments in which the article under test is a load board 102, the determination depicted at block 406 is typically made by the ATE in response to detecting a failure signature in the output signals received from electronic components 106.

In response to a negative determination at block 406, the process passes to block 420, which is described below. If, however, a determination is made at block 406 that a failure of replaceable component of the article is detected during the test, the process proceeds to block 410. Block 410 illustrates a user removing protective assembly 320 intact from the article under test and then replacing the failed component of the article. For example, at block 410, a human user may remove a failed component 106 from load board 102 and replace it with a like component 106. The process then returns to blocks 402-404, which depicts the user re-installing protective assembly 320 on the article and repeating the test with the replacement component(s).

Referring now to block 420, if no component failure was detected during the test, the test results are recorded, and the DUT 502 is removed from the test position. For example, when the DUT 502 is an integrated circuit, the ATE records the test results, and the test handler automatically removes DUT 502 from contactor 110 and places DUT 502 in a particular output tray based upon whether ATE indicates that DUT 520 passed or failed the test. A determination is then made at block 422 whether one or more additional DUTs remain to be tested. If so, the process returns from block 422 to block 404, which has been described. If, however, a determination is made at block 422 that all DUTs have been tested, the testing process depicted in FIG. 4 terminates at block 430.

As has been described, the present invention provides an improved protective assembly for protecting an article during testing, a process for making a protective assembly, and process for testing while utilizing a protective assembly to protect an article. By utilizing a protective assembly in accordance with the present invention, the number of DUTs possibly failing testing is reduced and yields are improved.

While the invention has been particularly shown as described with reference to a preferred embodiment, it will be understood by those skilled in the art that various changes in form and detail may be made therein without departing from the spirit and scope of the invention. For example, although the present invention has been described with reference to a preferred embodiment in which the article to be protected during testing is a circuit, and in particular, a circuit on a load board, those skilled in the art will appreciate the present invention is not limited to that particular preferred embodiment, but is instead applicable to protective assemblies for a wide variety of articles.

What is claimed is:

1. A process for making a protective assembly for protecting multiple circuits of similar topography, said process comprising:

conforming a flexible film of a watertight material to a topography of a first circuit among the multiple circuits of similar topography, wherein the conforming includes urging the flexible film into contact with the first circuit under differential pressure and wherein the flexible film is non-adhesive to the circuit;

forming a flexible layer of the protective assembly over the flexible film and the first circuit while urging the flexible film into contact with the circuit, wherein:

the forming includes adhering the flexible layer to the flexible film;

the flexible layer is conformed to the topography of the circuit;

forming a rigid support over the flexible layer, wherein the protective assembly includes the flexible film, the flexible layer and the rigid support;

removing the protective assembly intact from contact with the first circuit, wherein the flexible film and flexible layer retain conformance with the topography of the circuit following removal of the protective assembly;

thereafter, installing the protective assembly including the flexible film, flexible layer and rigid support over a second circuit among the multiple circuits of similar topography and securing the protective assembly over the second circuit to create a watertight seal of the flexible film about the second circuit;

operating the second circuit at an ambient temperature below 0° C. while the watertight seal is maintained; and thereafter, removing the protective assembly intact from the second circuit and repeating the installing, securing and operating steps for a third circuit among the multiple circuits of similar topography.

2. The process of claim 1, wherein said conforming step comprises conforming the flexible film to the topography of the circuit under urging of a vacuum.

3. The process of claim 2, wherein:

the circuit is disposed on a circuit board having at least one hole in the surface;

the process further comprises applying the vacuum to the flexible film via said at least one hole.

4. The process of claim 1, wherein said conforming step comprises conforming the flexible film to the topography of the circuit under urging of a positive applied pressure.

5. The process of claim 1, wherein the conforming step comprises conforming a silicone film.

6. The process of claim 1, further comprising curing the flexible layer.

7. The process of claim 1, wherein the forming step comprises forming the flexible layer of a silicone material.

8. The process of claim 1, wherein the forming step comprises forming the flexible layer in a mold.

9. The process of claim 1, further comprising establishing a radio frequency (RF) shield in the protective assembly.

10. The process of claim 1, and further comprising:

removing the protective assembly from the second circuit;

while the protective assembly is removed from the second circuit, replacing a component of the second circuit indicated by the operating as defective;

reinstalling the protective assembly over the second circuit and resecuring the protective assembly to create a watertight seal of the flexible film about the second circuit; and following the reinstalling, again operating the second circuit at an ambient temperature below 0° C. while the protective assembly is installed over the second circuit.

11. The process of claim 1, wherein the securing comprises removably attaching the protective assembly to a surface supporting the second circuit.

* * * * *